United States Patent
de Rooij et al.

(10) Patent No.: US 9,484,862 B2
(45) Date of Patent: Nov. 1, 2016

(54) DEVICE AND METHOD FOR BIAS CONTROL OF CLASS A POWER RF AMPLIFIER

(71) Applicant: Efficient Power Conversion Corporation, El Segundo, CA (US)

(72) Inventors: Michael A. de Rooij, Palm Springs, CA (US); Johan T. Strydom, Santa Clara, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 14/477,400

(22) Filed: Sep. 4, 2014

(65) Prior Publication Data

US 2015/0061777 A1    Mar. 5, 2015

Related U.S. Application Data

(60) Provisional application No. 61/873,653, filed on Sep. 4, 2013.

(51) Int. Cl.

| | |
|---|---|
| *H03F 3/21* | (2006.01) |
| *H03G 3/10* | (2006.01) |
| *H03F 1/02* | (2006.01) |
| *H03F 1/56* | (2006.01) |
| *H03F 3/195* | (2006.01) |
| *H03F 3/45* | (2006.01) |

(52) U.S. Cl.
CPC ............. *H03F 1/0261* (2013.01); *H03F 1/56* (2013.01); *H03F 3/195* (2013.01); *H03F 3/45475* (2013.01); *H03F 2200/18* (2013.01); *H03F 2200/222* (2013.01); *H03F 2200/387* (2013.01); *H03F 2203/45512* (2013.01); *H03F 2203/45528* (2013.01)

(58) Field of Classification Search
USPC ........ 330/285, 296, 295, 124 R, 84, 286, 53
See application file for complete search history.

(56) References Cited

U.S. PATENT DOCUMENTS

| | | | |
|---|---|---|---|
| 5,488,331 A | 1/1996 | Keane et al. | |
| 7,679,448 B1 * | 3/2010 | McAdam | H03F 1/301 330/149 |

OTHER PUBLICATIONS

S.J. Doo, et al. "Pulsed-IV Pulsed-RF Measurements Using a Large Signal Network Analzyer", 65th ARFTC Conference Digest, Jun. 2005, 7 pages.
I. Rosu, "Bias Circuits for RF Devices" http://www.qsl.net/va3iul/Bias/Bias, YO3DAC/CA3IUL, 20 pages.

* cited by examiner

*Primary Examiner* — Hieu Nguyen
(74) *Attorney, Agent, or Firm* — Blank Rome LLP

(57) ABSTRACT

A circuit and technique are provided to control bias setting to an FET based common source RF amplifier that can operate with large signals present. The circuit and technique described herein use a second FET in an identical circuit having the gate circuits connected in parallel and being sourced by the same drain voltage that serves as a reference to a first circuit bias setting. The drain current in a first FET will include both the bias and RF amplification current, whereas the second FET only carries the bias current. Because the devices and circuits are matched, the gate voltage variations will appear in both FETs thereby providing regulation of the drain current.

14 Claims, 3 Drawing Sheets

DEVICE AND METHOD FOR BIAS CONTROL OF CLASS A POWER RF AMPLIFIER

CROSS REFERENCE TO RELATED APPLICATIONS

This application claims the benefit of U.S. Provisional Application No. 61/873,653, filed on Sep. 4, 2013, the entire disclosure of which is hereby incorporated by reference.

BACKGROUND OF THE INVENTION

1. Field of the Invention

The present invention relates generally to amplifiers, and, more particularly to a technique to provide a controlled bias setting for a FET common source RF amplifier that can operate with a large signal present.

2. Description of the Related Art

FIG. 1 illustrates a schematic of a conventional Class A RF Power Amplifier with bias control used to amplify an RF signal. As shown, the conventional Class A RF Power Amplifier 10 includes an RF input 20 and an RF output 40, which outputs an amplified signal of the signal applied to RF input 20. Furthermore, a first DC blocking capacitor 22 is coupled between RF input 20 and an input matching circuit 24, which typically consists of an LC circuit. Likewise, a second DC blocking capacitor 42 is coupled between RF output 40 and an output matching circuit 44, which also typically consists of an LC circuit. The Class A RF Power Amplifier 10 also includes a switching transistor 30, which is always biased "ON" so that it conducts during one complete cycle of the input signal producing minimum distortion and maximum amplitude to the output.

Moreover, gate voltage bias 32 and input bias tee 34 are coupled to the gate of the switching transistor 30 and a drain voltage bias 36 and output bias tee 38 are coupled to the drain of the switching transistor 30. In this example of FIG. 1, input bias tee 34 and output bias tee 38 each comprise a simple inductor, although it should be appreciated that a capacitor can be provided across each of the gate voltage bias 32 and drain voltage bias 36 for non-ideal cases as would be understood to one skilled in the art. Conceptually, it should be appreciated that the inductors block the AC bias, but allows the DC bias from the gate voltage bias 32 and drain voltage bias 36, respectively.

For semiconductor devices used in power applications, such as the switching transistor 30 of amplifier 10 shown in FIG. 1, gallium nitride (GaN) semiconductor devices are increasingly desirable because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET).

A GaN HEMT device includes a nitride semiconductor with at least two nitride layers. Different materials formed on the semiconductor or on a buffer layer cause the layers to have different band gaps. The different material in the adjacent nitride layers also causes polarization, which contributes to a conductive two dimensional electron gas (2DEG) region near the junction of the two layers, specifically in the layer with the narrower band gap. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

FIG. 2 illustrates the transfer characteristics of an enhancement mode GaN® FET, i.e., a eGAN FET. As shown, an input voltage is applied to the eGaN FET and a bias point is determined. The bias point and the characteristics of the FET are used to amplify the input signal by effectively shifting the current based on the input voltage swing.

It is generally understood that the simplest form of MOSFET bias is to apply a fixed voltage to the gate which, in turn, defines the drain current (assuming linear region operation). This approach works well if there are no temperature variation effects. This is also the approach commonly used to control bias of a Class A Power RF amplifier 10, as shown above in FIG. 1.

Another conventional method to control bias is monitoring drain current feedback. This approach can be used for small signal amplification. The primary drawback of this approach is that when the RF power is high, it contributes significantly to the drain current and the bias controller will throttle back the bias setting in response. This transitions the amplifier from a class A to a class AB amplifier or even further to a class B amplifier or class C amplifier in extreme cases.

A third conventional method to control bias employs sample and hold circuits and is described in U.S. Pat. No. 5,488,331. In the described method, the bias control circuit employs a bias current sampling circuit for each associated amplifying device that measures the output current of its associated amplifying device and produces an output level that represents the output current of the device. Further, a sample/hold circuit samples the output level of the sampling at a time when a zero or null input level appears at the control electrode of the amplifying device. The circuit then applies a resulting output current bias signal to an input of a digital control circuit. The primary disadvantage of the approach described in U.S. Pat. No. 5,488,331 is that it is highly complex to implement and limited in its frequency use.

A fourth conventional method pulses a class A amplifier to control bias. This method adds complications as the RF choke can act as a boost inductor thereby establishing a voltage on the drain that can exceed the rating when the pulse transients occur rapidly. The challenges to large signal pulsed amplifier measurements are well-documented in S. J. Doo et al., "Pulsed-IV Pulsed RF Measurements Using a Large Signal Network Analyzer," 65th ARFTG Conference Digest, June 2005.

SUMMARY OF THE INVENTION

In view of the foregoing limitations discussed above, the present invention provides a technique to provide a controlled bias setting to an FET based common source RF amplifier that can operate even with a large signal present. The technique described herein uses a second FET in an identical circuit having the gate circuits connected in parallel and being sourced by the same drain voltage that serves as a reference to the first circuit bias setting. The drain current in the first FET will include both the bias and RF amplification current, whereas the second FET only carries the bias current. Because the devices and circuits are matched, the gate voltage variations will appear in both FETs thereby providing regulation of the drain current.

In one embodiment, a Class A RF Power Amplifier is provided including a first transistor having a gate coupled to an input matching circuit and a first input tee and a drain coupled to an output matching circuit and a first output tee and a second transistor having a gate coupled to a second input tee and a drain coupled to a second output tee. Furthermore, a control circuit is provided that is coupled between the first and second input tees and the first and second output tees, the control circuit being configured to control a drain current of the first transistor.

In another embodiment, a method is provided for controlling of bias control of a Class A power RF amplifier. The method includes the steps of measuring a drain current between a first output bias tee coupled to a drain of a first transistor and a second output bias tee coupled to a drain of a second transistor; comparing, by an operational amplifier, the measured drain current with a voltage output by a pulsed voltage source; and adjusting a DC bias for the first transistor based on an output signal of the operational amplifier.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

The present invention provides a technique and circuit design to provide a controlled bias setting to a field effect transmitter (FET) based common source radio frequency (RF) amplifier that can operate with large signals present. The disclosed technique and circuit design can be used with continuous wave and pulsed transmission operations. The technique and circuit uses a second control FET in an identical circuit having gate circuits connected in parallel and is sourced by the same drain voltage that serves as a reference voltage to the first circuit bias setting. The drain current in the main FET may include both the bias and RF amplification current, whereas the second control FET only carries a bias current. Since the devices and circuits are matched, the gate voltage variations will appear in both the main and control FETs thereby providing regulation of the drain current. Preferably, the present technique and circuit utilizes FETs with parameters that are closely matched. Furthermore, in one embodiment, the technique and circuit can be further enhanced by integration of the second FET into the first FET.

Figure 3:
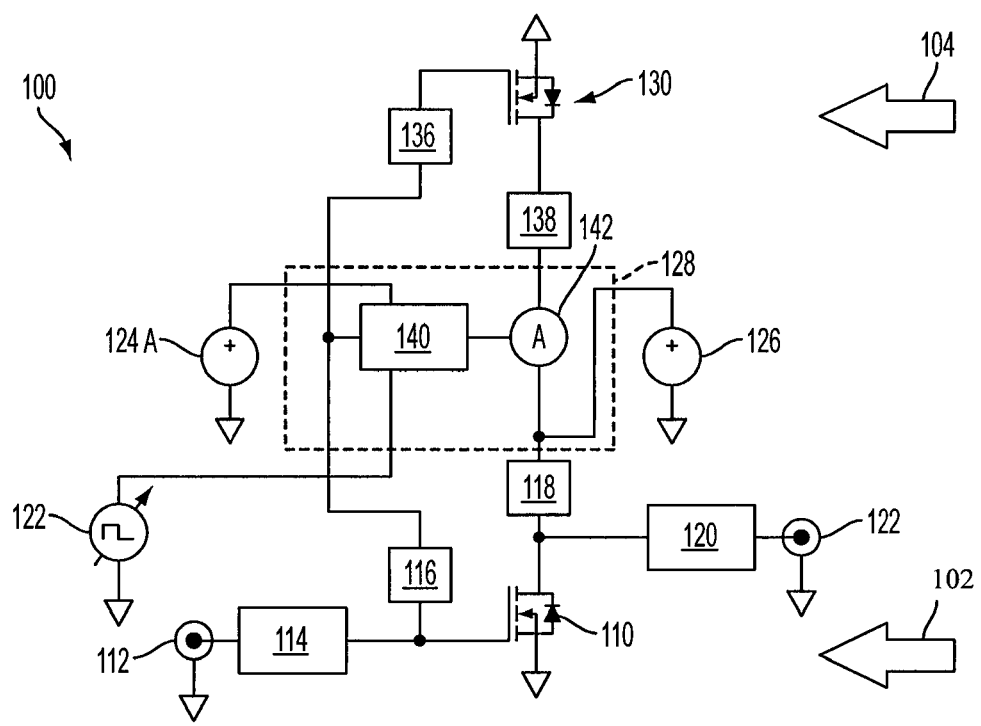
FIG. 3 illustrates an RF amplifier circuit with bias circuit according to an exemplary embodiment of the present invention.

FIG. 3 illustrates an RF amplifier circuit 100 according to an exemplary embodiment of the present invention. In general, the RF amplifier circuit 100 includes a main circuit 102 to amplify an RF input signal and a control circuit 104 that serves as a reference voltage to the bias setting for the main circuit. As will be described in detail below, the main circuit 102 includes FET 110 and the control circuit 104 includes FET 130. Preferably, both FET 110 and FET 130 are enhancement mode GaN FETs.

As shown, RF amplifier circuit 100 includes a first or main FET 110 (or DUT) that is provided to amplify an RF input signal provided to an RF input 112. The RF input signal is passed from the RF input 112 to an input matching circuit 114. The output of the input matching circuit 114 is combined with a DC biased signal from an input bias tee 116 and is applied to the gate terminal of the main FET 110. Although not shown in detail, each of the input and output bias tees disclosed herein consists of only passive components (e.g., inductors) as discussed above, the function of which is to block the AC bias, but allow the DC bias from respective voltage bias supplies.

Figure 1:
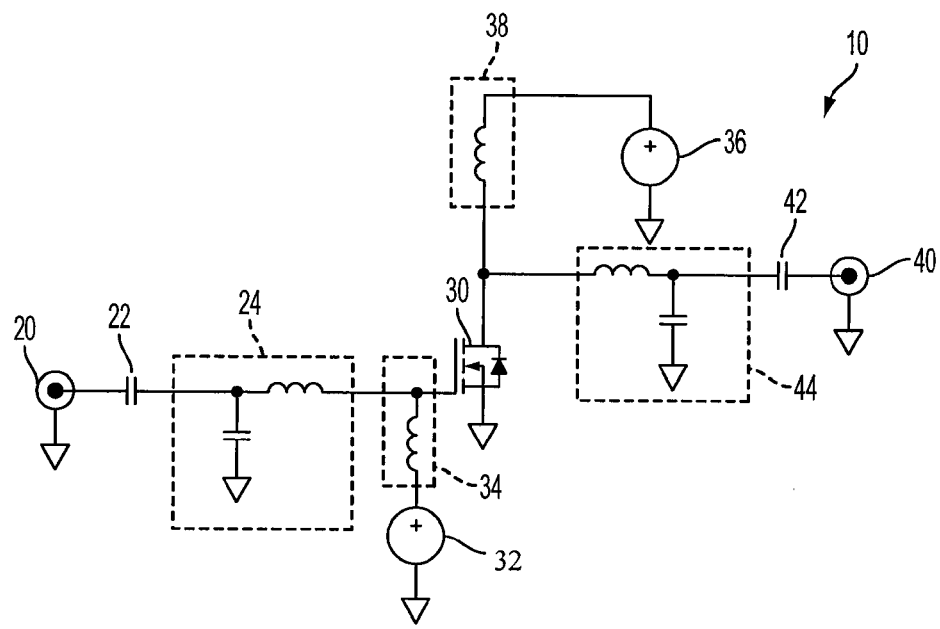
FIG. 1 illustrates a schematic of a conventional Class A RF Power Amplifier with bias control used to amplify an RF signal.
Figure 2:
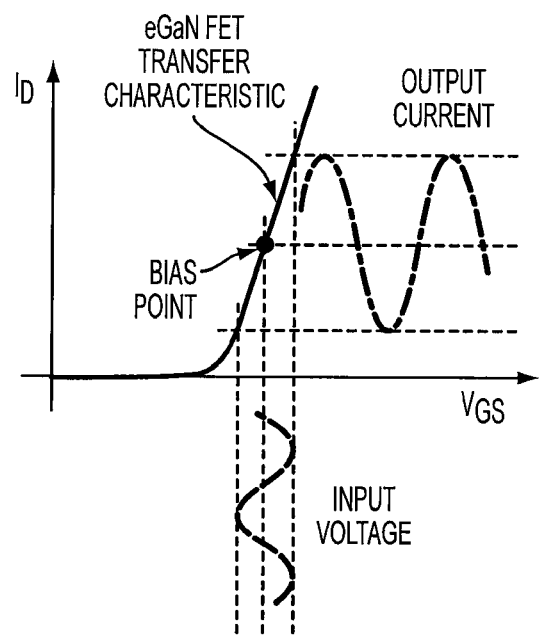
FIG. 2 illustrates a graph of the transfer characteristics of an enhancement mode GaN FET.

As further shown, the drain of the FET 110 is connected to an output bias tee 118 and an output matching circuit 120. The drain current from the main FET 110 includes both the bias and RF amplification current. This amplified signal is then passed through the output matching circuit 120 to the RF output 122. In should be appreciated that this portion of the main circuit 102 is similar to the prior art circuit described above with respect to FIG. 1. However, as noted above, the prior art designs suffers from certain limitations that are overcome by the control circuit illustrated in FIG. 3.

In particular, the control circuit 104 includes a control FET 130 with a gate circuit that is connected in parallel with FET 110 and sourced by the same drain voltage bias 126 that serves as a reference to the first bias setting. As shown, the gate of the FET 130 is coupled to an input bias tee 136. As will be described in detail with reference to FIG. 4, the input bias tee 136 of the control circuit 104 and the input bias tee 116 of the main circuit 102 are both coupled to an output of a controller 128. In addition, an output bias tee 138 is connected between the drain of the control device 130 and the output bias tee 118 of the main circuit 102. The output bias tee 138 of the control circuit 104 and the output bias tee 118 of the main circuit 102 are coupled to one another with an current sensor 142 (e.g., an ammeter) of the controller 128 coupled there-between and the drain voltage bias 126 applied to both output bias tees 118 and 138. An output signal of the current sensor 142 is fed to a proportional plus integral (PI) controller 140.

As further shown, a scalable gate pulsed voltage source 122 and a gate voltage bias 124 are provided as inputs to controller 128. Gate voltage bias 142 is provided to power the PI controller 140 and current sensor 142, although it is noted that this connection is not shown in FIG. 4 for illustration purposes. It should also be appreciated that FET 130 of control circuit 104 is not coupled to the RF input signal provided to RF input 112, which enables the FET 130 to serve as the reference voltage to the bias setting for the main circuit 102.

Figure 4:
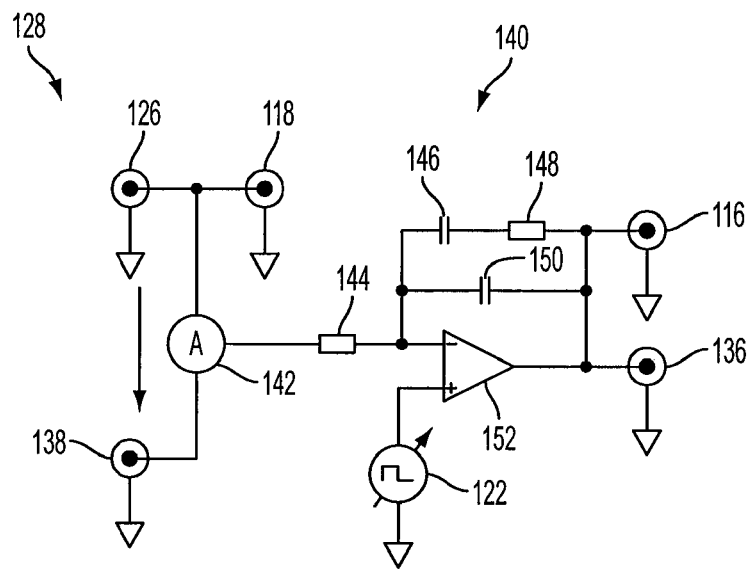
FIG. 4 illustrates an exemplary embodiment of the controller of the RF amplifier circuit illustrated in FIG. 3.

FIG. 4 illustrates an exemplary embodiment of the controller 128 of the RF amplifier circuit 100. Controller 128 serves as a drain current controller, and, in particular, the downward facing arrow adjacent to current sensor 142 illustrates the control FET drain current of the RF amplifier circuit 100.

As shown in FIG. 4 as also explained above, the current sensor 142 (or any similar current sensor) is provided between output bias tee 118 and drain voltage bias 126 and the output bias tee 138 of the control circuit 104. The current sensor 142 is coupled to a negative terminal of an operational amplifier 152, preferably with a resistor 144 coupled in series between the two. The operational amplifier 152 forms part of a proportional plus integral (PI) controller 140. In addition, a negative feedback loop coupled from the output of the operation amplifier 152 is coupled to the negative input terminal (i.e., the inverting terminal) of the operational amplifier 152. The negative feedback loop can include a first capacitor 150 and a second capacitor 146 and resistor 148 coupled in parallel with the first capacitor 150. The output of the operational amplifier 152 is also coupled to the input bias tee 116 of the main circuit 102 and the input bias tee 136 of the control circuit 104. Furthermore, the scalable gating pulse 122 is coupled to the positive terminal (i.e., the non-inverting input) of the operation amplifier 152. Although not shown, in one refinement of the exemplary embodiment, the drain current controller 128 can include dual, identical current sensors in which the second sensor is used to ensure the main and control circuits are identical and provide drain current information for drain efficiency measurement.

Figure 5:
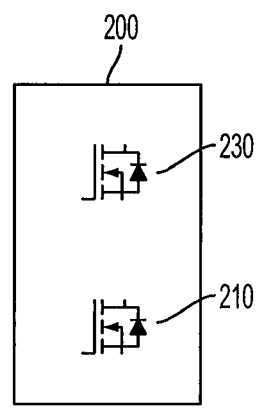
FIG. 5 illustrates an integrated control FET with a main FET according to an exemplary embodiment of the present invention.

The present disclosure further contemplates that both the main FET 110 and control FET 130 can be integrated into a single device. FIG. 5 depicts a block diagram of integrated device 200 with a control FET 230 and the main FET 210 integrated into the single device 200. It is contemplated that the integrated control FET 200 has the same basic design as the main FET 210, and may be scaled in size relative to the main FET 210. The integrated control FET can be used as a dual FET for alternative class amplifiers.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed:

1. An RF amplifier comprising:
    a first transistor having a gate coupled to an input matching circuit and a first input tee and a first transistor drain coupled to an output matching circuit and a first output tee;
    a second transistor having a gate coupled to a second input tee and a second transistor drain coupled to a second output tee;
    a single drain voltage bias supply in electrical communication with both the first transistor drain and the second transistor drain; and
    a control circuit coupled between the first and second input tees and the first and second output tees, the control circuit being configured to control a drain current of the first transistor, the control circuit comprising: (1) a current sensor coupled between the first output tee and the second output tee, and (2) an operational amplifier having an inverting input coupled to an output of the current sensor and a non-inverting input coupled to a scalable pulse voltage source.

2. The RF amplifier according to claim 1, wherein an output of the operational amplifier is coupled to the first input bias tee and the second input bias tee.

3. The RF amplifier according to claim 2, wherein the control circuit is configured to adjust a DC bias for the first transistor by comparing the drain current measured by the ammeter between the first and second output tees with a voltage output from the scalable pulse voltage source.

4. The RF amplifier according to claim 3, wherein the control circuit further comprises a negative feedback loop between the output of the operational amplifier and the inverting input of the operational amplifier.

5. The RF amplifier according to claim 3, wherein the control circuit further comprises a second current sensor drain efficiency measurement.

6. The RF amplifier according to claim 1, wherein the drain voltage bias supply is coupled between the current sensor and the first output tee.

7. The RF amplifier according to claim 6, wherein a voltage output from the drain voltage bias supply serves as a reference voltage to the RF amplifier bias setting.

8. The RF amplifier according to claim 1, wherein the first and second transistors are enhancement mode GaN FETs.

9. The RF amplifier according to claim 1, wherein the first and second transistors are integrated on a single semiconductor device.

10. The RF amplifier according to claim 1, wherein the RF amplifier is a Class A power amplifier.

11. A method of bias control of a Class A power RF amplifier, the method comprising:
    coupling a single drain voltage bias supply to both a drain of a first transistor and a drain of a second transistor;
    measuring a drain current with a current sensor coupled between: (1) a first output bias tee coupled to the drain of the first transistor and (2) a second output bias tee coupled to the drain of the second transistor;
    comparing, by an operational amplifier, the measured drain current with a voltage output by a pulsed voltage source, the operational amplifier having an inverting input coupled to an output of the current sensor and a non-inverting input coupled to the pulse voltage source; and
    adjusting a DC bias for the first transistor based on an output signal of the operational amplifier.

12. The method according to claim 11, further comprising applying an RF input voltage and the DC bias to a gate of the first terminal.

13. The method according to claim 12, further comprising applying a voltage output from the drain voltage bias supply as a reference voltage for a bias setting of the Class A power RF amplifier.

14. The RF amplifier according to claim 1, wherein a gate circuit of the first transistor and a gate circuit of the second transistor are connected in parallel.

\* \* \* \* \*